United States Patent
Matsumura et al.

(10) Patent No.: US 6,349,669 B1
(45) Date of Patent: Feb. 26, 2002

(54) METHOD AND APPARATUS FOR DEPOSITING A THIN FILM, AND SEMICONDUCTOR DEVICE HAVING A SEMICONDUCTOR-INSULATOR JUNCTION

(75) Inventors: Hideki Matsumura, 3-93, Minamishijima, Kanazawa-shi, Ishikawa; Akira Izumi; Atsushi Masuda, both of Ishikawa; Yasunobu Nashimoto; Yosuke Miyoshi, both of Tokyo; Shuji Nomura, Tachikawa; Kazuo Sakurai, Fuchu; Shouichi Aoshima, Inagi, all of (JP)

(73) Assignees: Hideki Matsumura, Kanazawa; NEC Corporation, Ishikawa; Anelva Corporation, Tokyo, all of (JP)

( * ) Notice: Subject to any disclaimer, the term of this patent is extended or adjusted under 35 U.S.C. 154(b) by 0 days.

(21) Appl. No.: 09/102,665

(22) Filed: Jun. 23, 1998

Related U.S. Application Data

(62) Division of application No. 08/924,304, filed on Sep. 5, 1997.

(30) Foreign Application Priority Data

Sep. 6, 1996 (JP) .............................. 8-256775

(51) Int. Cl.[7] .............................................. C23C 16/00
(52) U.S. Cl. ................................ 118/723 HC; 118/715
(58) Field of Search ................................ 118/715, 719, 118/723 HC; 427/585–587

(56) References Cited

U.S. PATENT DOCUMENTS

| | | | | |
|---|---|---|---|---|
| 5,054,421 A | * | 10/1991 | Ito et al. | 118/723 |
| 5,149,375 A | * | 9/1992 | Matsuyama | 118/719 |
| 5,183,529 A | * | 2/1993 | Potter et al. | 156/613 |
| 5,186,973 A | * | 2/1993 | Garg et al. | 427/590 |
| 5,209,812 A | * | 5/1993 | Wu et al. | 156/613 |
| 5,591,484 A | * | 1/1997 | Poncelet et al. | 427/249 |
| 5,693,173 A | * | 12/1997 | Colombo et al. | 156/345 |
| 6,069,094 A | * | 5/2000 | Matsumura et al. | 438/788 |

* cited by examiner

*Primary Examiner*—Jeffrie R Lund
(74) *Attorney, Agent, or Firm*—Armstrong, Westerman, Hattori, McLeland & Naughton, LLP

(57) ABSTRACT

This invention discloses a method and apparatus where a pre-treatment which reduce interfacial level density is carried out before thin film deposition on a substrate utilizing a catalytic gas phase reaction. The catalytic gas phase reaction is generated with a treatment gas which is supplied with the substrate via a thermal catalysis body provided near the substrate surface. Thin film deposition on the substrate surface is carried out after this pre-treatment. The thermal catalysis body is made of tungsten, molybdenum, tantalum, titanium or vanadium, and is heated by a heater. And, this invention also discloses a semiconductor device having a semiconductor-insulator junction with its interfacial level density is $10^{12}$ eV$^{-1}$ cm$^{-2}$ or less, which is brought by the above pre-treatment in the insulator film deposition process.

13 Claims, 5 Drawing Sheets

METHOD AND APPARATUS FOR DEPOSITING A THIN FILM, AND SEMICONDUCTOR DEVICE HAVING A SEMICONDUCTOR-INSULATOR JUNCTION

This application is a division of prior application Ser. No. 08/924,304 filed Sep. 5, 1997.

BACKGROUND OF THE INVENTION

Field of the Invention

This invention relates to fabrication of semiconductor devices such as large scale integrated circuits (LSI) and other electronics devices such as liquid crystal displays (LCD). Especially, this invention relates to a thin film deposition process where a thin film is deposited on the surface of an underlayer of dissimilar material utilizing a chemical vapor deposition (CVD) method.

A thin film deposition process is carried out in fabrication of semiconductor devices such as LSI and other electronics devices such as LCD. CVD methods have been widely utilized for this process. In CVD methods, plasma-enhanced CVD (PECVD) which utilizes plasma energy for a gas-phase reaction is major. FIG. 6 shows a schematic view of a PECVD apparatus as an example of conventional thin film deposition apparatuses.

The apparatus shown in FIG. 6 is mainly composed by process chamber 1 comprising a pumping system, substrate holder 2 for placing substrate 20 in process chamber 1, deposition gas introduction system 3 for introducing a deposition gas into process chamber 1 and electric power supplying means 4 to supply energy with the introduced deposition gas to generate a plasma.

Deposition gas introduction system 3 introduces the deposition gas through disc shaped gas introduction head 31 which is provided facing to substrate holder 2. Gas introduction head 31 is hollow and has many gas effusion holes 32 at its front side. The end of pipe 33 introducing the deposition gas is connected with gas introduction head 31 so that the deposition as can effuse from gas effusion holes 32 toward substrate 20.

Electric power supplying means 4 is composed so as to supply a radio frequency (RF) power as plasma generation energy. Gas introduction head 31 is commonly used as an electrode for applying the RF. Specifically, introduction head 31 is made of conductor and is connected with RF source 41 interposing a matching box (not shown).

The apparatus shown in FIG. 6 is operated as follows. The deposition gas is introduced into process chamber 1 by deposition as introduction system 3. Controlling a flow rate of the deposition gas, an RF field is applied by RF source 41 from gas introduction head 31. This RF field ignites a discharge with the deposition gas, thus transformed into plasma, which is utilized for thin film deposition on the surface of substrate 20. Taking an example of thin film deposition, silicon nitride film is deposited utilizing decomposition of silane ($SiH_4$) in the plasma which is generated by silane and ammonia ($NH_3$) gas mixture used as the deposition gas.

In thin film deposition processes as described, materials of thin films are often dissimilar to underlayers. For example, in fabrication of insulated-gate field effect transistors (IGFET), an insulator film is deposited on an underlying semiconductor and a gate is formed on the insulator film. As another example, an insulator film is often deposited on a semiconductor surface for passivation.

It is very critical to reduce interfacial defects in the dissimilar material thin film deposition. For example, if defects are produced on the insulator-semiconductor interface in the IGFET, operation of the transistor may become impossible because of breakdown of the insulator film.

PECVD apparatuses have little problem of interfacial defects caused by heat, because depositions are carried out under temperatures lower than normal thermal CVD apparatuses. However, PECVD apparatuses have a problem that interfacial defects caused by incidence of high-energy charged particles produced in plasma. More specifically, when an insulator film is deposited on a substrate surface which suffered a physical damage such as local deformation caused by high-energy ions impingement onto the substrate surface, or when incidence of high-energy eons onto a deposited insulator film occurs, local deformation defects such as a pin hole are produced in the insulator film, which leads to the defect on product that breakdown may occur with its insulator film. As another possibility, if ions or electrons are incorporated into an insulator film, resistance of the insulator film may decrease causing breakdown voltage fall. Moreover, the incorporation of ions or electrons into an insulator film leads to carrier implantation that causes electron traps, resulting in deterioration of device performance properties.

Though PECVD apparatuses can deposit films at low temperatures compared with thermal CVD apparatuses, there is a limitation in lowering deposition temperature (temperature of a substrate during deposition), because the substrate is exposed to a plasma. Therefore, PECVD apparatuses probably can not satisfy the demand of further lowering of deposition temperature. For example, compound semiconductors of gallium arsenide (GaAs) series have a problem that arsenic atoms dissociate out of the compound at temperatures over 400° C. Prior PECVD apparatuses sometimes have difficulty in operation at temperatures below 400° C.

On the other hand, reducing interfacial energy level density is also a crucial technical matter with respect to state of insulator-semiconductor interface. The interfacial energy levels, which are also called "interface traps" or "interface state", are inevitably generated on dissimilar materials junction such as semiconductor-insulator junction, namely heterojunction. When the interfacial level density increases, a problem that charging and discharging on the interfacial levels, that is, traps and releases of electrons make a cause of noise and affect operation characteristics becomes serious. In IGFETs using a semiconductor of gallium arsenide series, a surface depletion layer is formed resulting from high-density interfacial levels. The surface depletion layer influences generation of great parasitic resistance on the channel surface. This is a hurdle for higher function of devices.

From a point of view of process, generation of high-density interfacial levels is significantly influenced by state of an underlying semiconductor surface when deposition is carried out. Specifically, if a thin film is deposited on an underlying semiconductor which impurity molecules such as water or oxygen stick on, the high-density interfacial levels are easily generated because the thin film grows under existence of such impurity molecules.

A native oxide layer is often formed on a semiconductor surface. When a insulator film is deposited on this native oxide layer, many levels are generated by this native oxide layer, which leads easily to high-density interfacial levels. To solve this problem, deposition should be carried out after removal of the native oxide layer. Sulfuric acid ($H_2SO_4$) or hydrogen peroxide ($H_2O_2$) is used for the removal of the native oxide layer. However, it is difficult to remove only the native oxide layer completely by this method. Moreover, such a wet process as this brings the problem that the substrate is contaminated.

SUMMARY OF THE INVENTION

The object of the present invention is to solve these problems described above. Specifically, the object of the present invention is to provide a method and apparatus where interfacial level density can be reduced effectively and deposition temperature can be lowered furthermore. Another object of the present invention is to provide a semiconductor device having a semiconductor-insulator junction of low interfacial level density.

To achieve these object, the present invention provides a method and apparatus where a pre-treatment which reduce interfacial level density is carried out before deposition utilizing a catalytic gas phase reaction. And, the present invention provides a semiconductor device having a semiconductor-insulator junction with its interfacial level density is $10^{12}eV^{-1}cm^{-2}$ or less, which is brought by the pre-treatment in the insulator film deposition process.

PREFERRED MODES OF THE INVENTION

Figure 1:
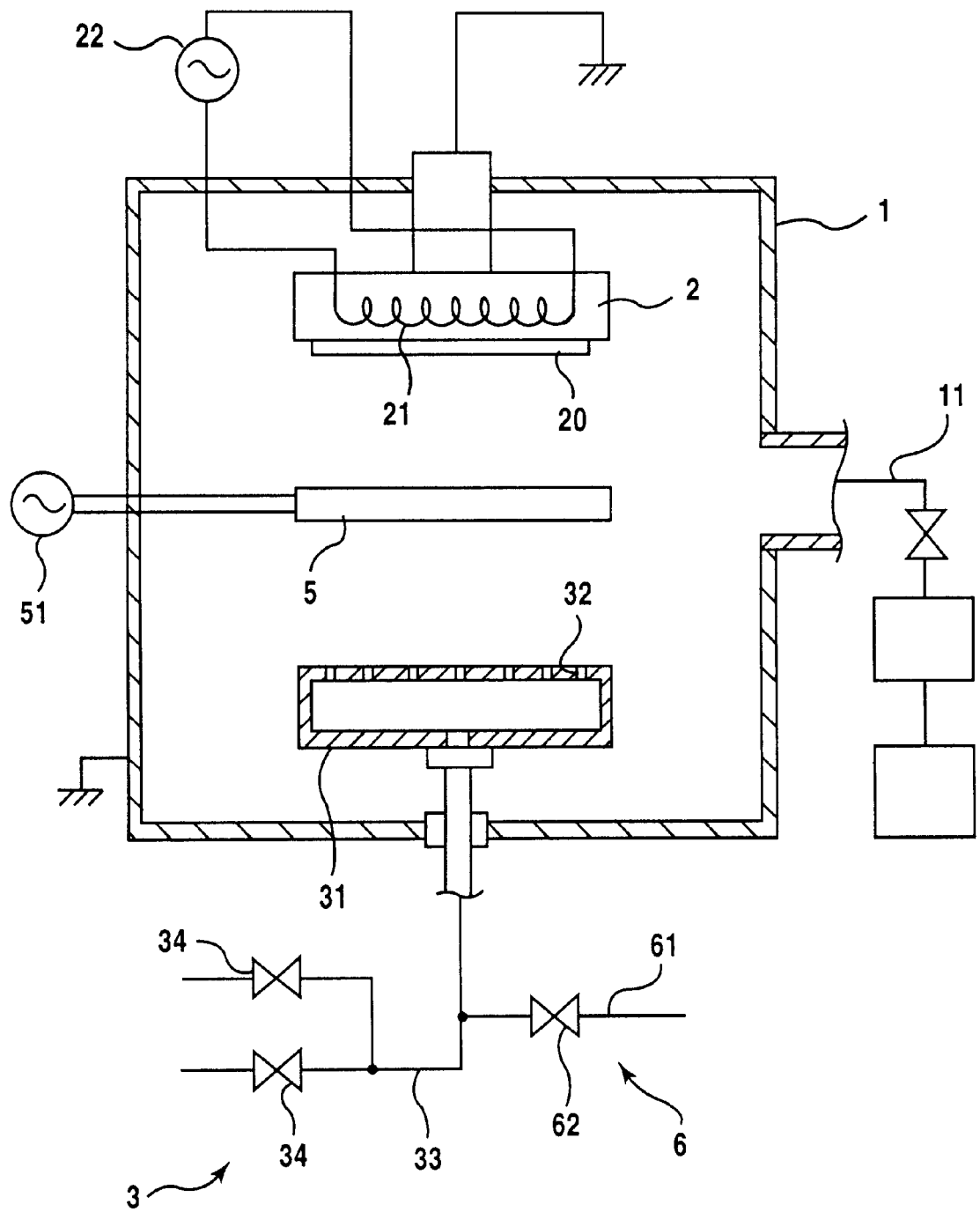
FIG. 1 shows a schematic view of a thin film deposition apparatus of a mode of the invention.

Preferred modes of the invention are described as follows. First of all, modes of a thin film deposition method and apparatus are described. FIG. 1 shows a schematic view of a thin film deposition apparatus of a mode of the invention. The apparatus shown in FIG. 1 comprises a process chamber 1 in which a substrate 20 is placed, substrate holder 2 for placing substrate 20 in process chamber 1, deposition gas introduction system 3 for introducing a deposition gas into process chamber 1, a thermal catalysis body 5 provided near the substrate placement, a heater 51 for heating thermal catalysis body 5 up to a certain temperature.

Process chamber 1 is an air-tight vacuum chamber comprising a pumping system 11. Pumping system 11 is a multi-stage type system which uses multiple vacuum pumps such as a combination of a turbo-molecular pump and a mechanical-sealed pump. Pumping system 11 can pump process chamber 1 to order of $10^{-8}$ Torr.

Substrate holder 2 is provided at the upper wall of process chamber 1. Substrate 20 is held on the lower surface of substrate holder 2. Holding of substrate 20 is carried out by an electrostatic chucking method inducing static charges on the lower surface of substrate holder 2, or a mechanical chucking method using a clamp which cross-section shape is "L".

Heater 21 for heating substrate 20 up to a certain temperature is provided in substrate holder 2. A resistance heating type heater is typically used as heater 21. Heater 21 is connected with power supply 22 provided outside process chamber 1. Power supply 22 is equipped with control unit (not shown) which controls the input power to heater 21 according to a output signal from a temperature monitor (not shown) monitoring temperature of substrate 20 or substrate holder 2.

Figure 2:
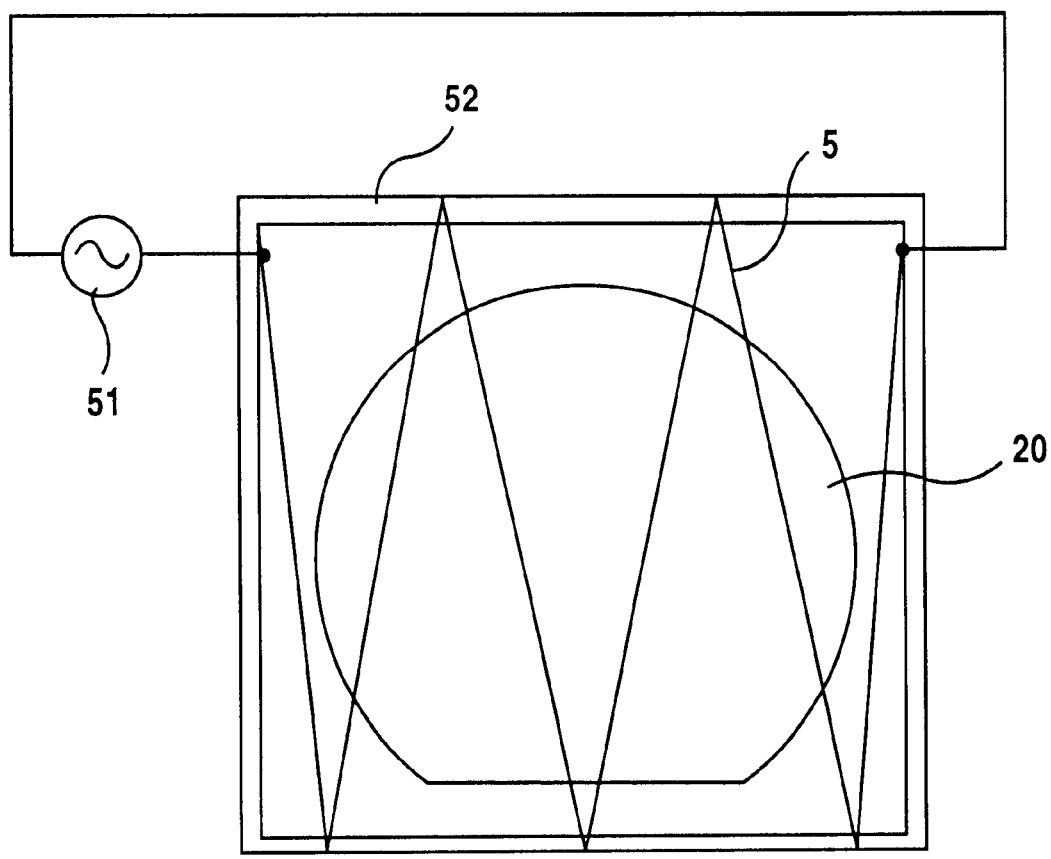
FIG. 2 shows a schematic plane view of a thermal catalysis body employed with the apparatus of FIG. 1

Thermal catalysis body 5 characterizes the apparatus of this mode. Thermal catalysis body 5 is employed so that deposition is carried out utilizing a gas-phase reaction of the deposition gas without using plasma. FIG. 2 shows a schematic plane view of thermal catalysis body 5 employed in the apparatus of FIG. 1. In this mode, 0.5 mm diameter tungsten wire is used as thermal catalysis body 5. The tungsten wire as thermal catalysis body 5 is formed into a saw-tooth-wave shape shown in FIG. 2 and fixed with square-shaped frame 52 which is a little larger than substrate 20. Frame 52 is made of molybdenum. The distance between thermal catalysis body 5 and substrate 20 is, for example, 20 cm. Thermal catalysis body 5 is desirably provided close to substrate 20 because the effect of a catalytic reaction (described after) is decreased if the distance between thermal catalytic body 5 and substrate 20 is wider.

Heater 51 which heats thermal catalysis body 5 is composed mainly by a resistance heating power supply letting a current flow through the tungsten wire. Thermal catalysis body 5 is heated up to, for example, 1700° C. by heater 51.

Deposition gas introduction system 3 comprises pipe 33 introducing the deposition gas to process chamber 1, and valve 34 and gas flow controller (not shown) provided on pipe 33. As shown in FIG. 1, disc-shaped gas introduction head 31 is provided facing to substrate holder 2 in process chamber 1. Gas introduction head 31 is hollow and has many gas effusion holes 32 at its front side. The end of pipe 33 is connected with gas introduction head 31 so that the deposition gas can effuse from gas effusion holes 32 for substrate 20.

The deposition gas effusing from gas effusion holes 32 are supplied with substrate 20 via thermal catalysis body 5. This results in that a thin film is deposited on the surface of substrate 20 utilizing a catalytic gas-phase reaction of the deposition gas by thermal catalysis body 5.

Figure 3:
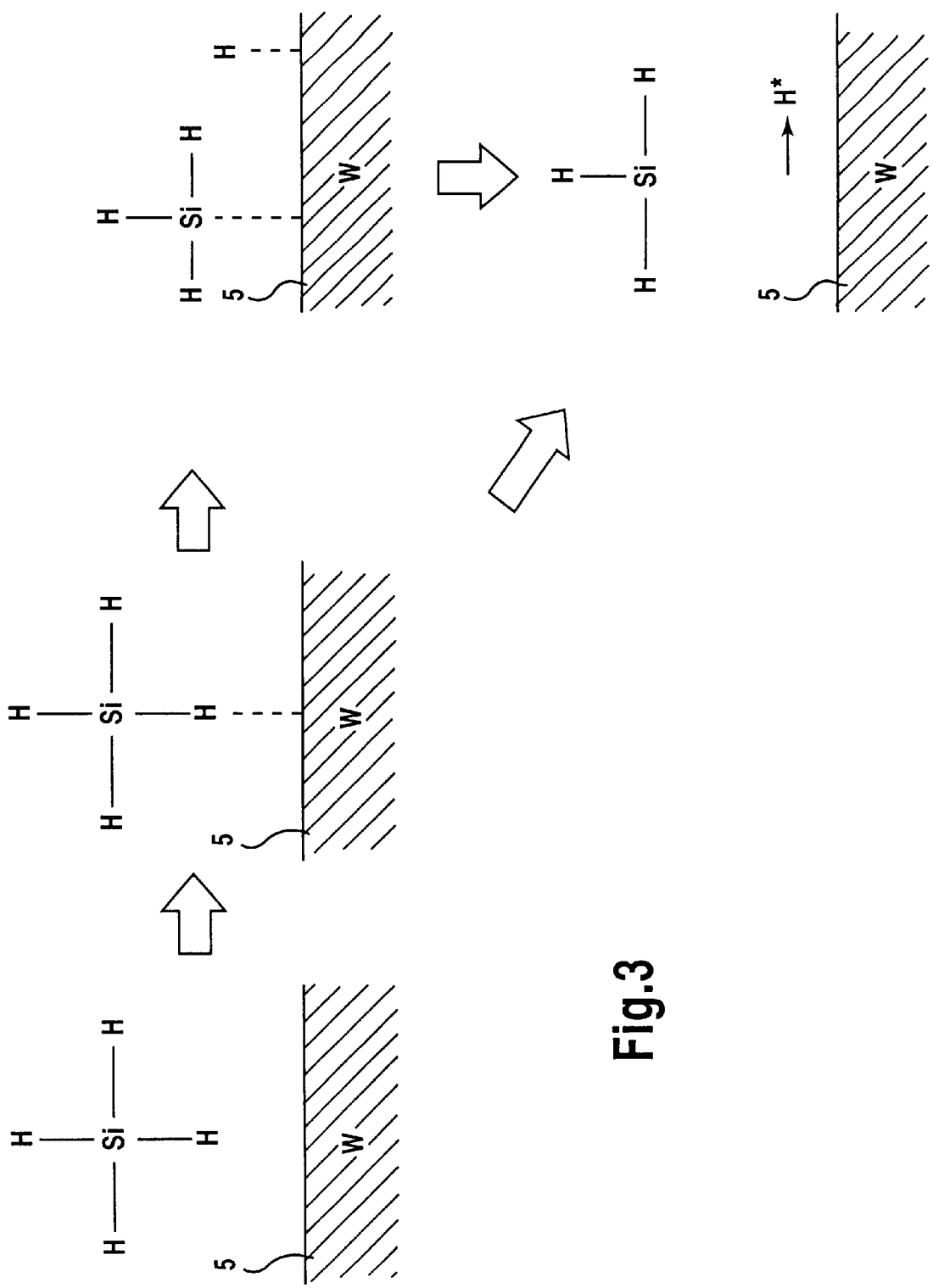
FIG. 3 explains a model of film growth in catalytic CVD (CAT-CVD) methods.

This type of CVD is called "catalytic CVD" (CAT-CVD). The model of the film growth in CAT-CVD has not been clarified in detail. However, taking silicon nitride film as an example, that is understood as follows. FIG. 3 explains the model of the film growth in CAT-CVD. To deposit a silicon nitride film, gas mixture such as silane and ammonium gas mixture is used as the deposition gas. When introduced silane gas passes by thermal catalysis body 5, a contact decomposition reaction similar to the adsorptive dissociation reaction of hydrogen molecular takes place. This contact decomposition reaction produces fractional radicals $SiH_3^*$ and $H^*$. Though the detailed mechanism is not clear, it is considered that if one hydrogen atom composing a silane molecular is adsorbed on the hot tungsten surface, the H-Si bond is weakened resulting in that the silane is decomposed to produce $SiH_3^*$. Adsorbed H is released from the tungsten surface by heat to become $H^*$. With ammonium gas a similar contact decomposition reaction considerably takes place, which produces the fractional radicals $NH_2^*$ and $H^*$. These fractional radicals arrive at the substrate surface to contribute to the silicon nitride film growth. This film growth mechanism is expressed by formulas;

$$SiH_{4(g)} \rightarrow SiH_3^*{}_{(g)} + H^*{}_{(g)}$$

$$NH_{3(g)} \rightarrow NH_2^*{}_{(g)} + H^*{}_{(g)}$$

$$aSiH_3^*{}_{(g)} + bNH_2^*{}_{(g)} \rightarrow cSiN_{x(s)}$$

where suffix (g) means "gas phase" and suffix (s) means "solid phase".

Film deposition by the CAT-CVD method does not use plasmas. Therefore, the CAT-CVD is essentially free from problems such as the substrate surface damage by incidence of high-energy charged particles from plasma and deterioration of insulator film by incorporation of charged particles as demonstrated in PECVD apparatuses. The CAT-CVD has another advantage that lower-temperature processes are possible because the substrate is not exposed to plasma.

Now, what characterizes the apparatus of this mode most is in that thermal catalysis body 5 is commonly used for a pre-treatment that reduces interfacial defects. This point is described in detail as follows.

In studies by inventors, it was turned out that a surface treatment which denaturalizes or cleans a surface is possible when a different gas is used in the composition of the CAT-CVD. It was also turned out that high-quality films can be deposited when such a treatment as that is carried out before deposition.

For example, when hydrogen gas is introduced from gas introduction head 31, hydrogen gas is activated by the contact decomposition reaction on thermal catalysis body 5, producing hydrogen radicals. By these hydrogen radicals a surface cleaning that removes a native oxide layer on a substrate surface is possible. Specifically, in case that a substrate surface is gallium arsenide semiconductor, hydrogen radicals react with oxygen (O) in the native oxide layer formed on the gallium arsenide surface to dissociate O from gallium arsenide. Oxygen reacts hydrogen radicals to form $H_2O$ which is evacuated from process chamber 1 by pumping system 11. This is expressed as;

$$H_2 \rightarrow 2H^*$$

$$2H^* + Ga—O(or\ As—O) \rightarrow Ga(or\ As) + H_2O_{(g)}$$

When ammonium (NH3) gas is introduced from gas introduction head 31, a treatment to denaturalize a substrate surface for passivation is possible utilizing fractional radicals produced by a contact deposition reaction of ammonium on thermal catalysis body 5. Specifically, in case that a substrate surface is gallium arsenide semiconductor as well, when activated $NH_2^*$ arrives at the substrate surface, $NH_2^*$ reacts with oxygen (O) in the native oxide layer on the gallium arsenide surface. This is expressed as;

$$NH_3 \rightarrow NH_2^* + H^*$$

$$NH_2^* + Ga—O(or\ As-O) \rightarrow Ga—N(or\ As—N) + H_2O_{(g)}$$

In this case, because there are stable bonds such as Ga—N (or As—N) on the top surface of gallium arsenide. recombination of gallium arsenide and released oxygen does not occur. In addition, compared to the native oxide layer. Ga—N (or As—N) bond is easily dissociated when thin film is deposited on it. This also contributes to flattening of the GaAs-film interface.

Taking these points into consideration, the apparatus of this mode comprises treatment gas introduction system 6. Treatment as introduction system 6 is connected with deposition gas introduction system 3. As another composition, part of deposition gas introduction system 3 may be commonly used for a treatment gas introduction system. In a case that treatment gas is completely different from deposition gas, for example, deposition gas is silane-ammonium gas mixture and treatment gas is hydrogen, pipe 61 of treatment gas introduction system 6 is connected with pipe 33 of deposition gas introduction system 3. In this case, the treatment gas is introduced switching from the deposition gas by operation of valve 34 and 62.

In another case that treatment gas is partly common to deposition gas, for example, the deposition gas is silane-ammonium gas mixture and the treatment gas is ammonium, introduction of the treatment gas is carried out commonly using a part of deposition gas introduction system 3. In this case, only the treatment gas can be introduced by operation of valve 34 in deposition gas introduction system 3. Ammonium is one example of nitrogen bearing gases. Of course, nitrogen gas and nitrogen compound gas such as hydrazine ($N_2H_4$) are included in "nitrogen bearing gases" other than ammonium.

Anyway, a treatment gas effuses from gas effusion holes 32 of gas introduction head 31 and is supplied with substrate 20. In this gas introduction, a treatment gas flows near or on the surface of thermal catalysis body 5, resulting in that a treatment is carried out on the substrate surface by a contact decomposition reaction as described.

Figure 4:
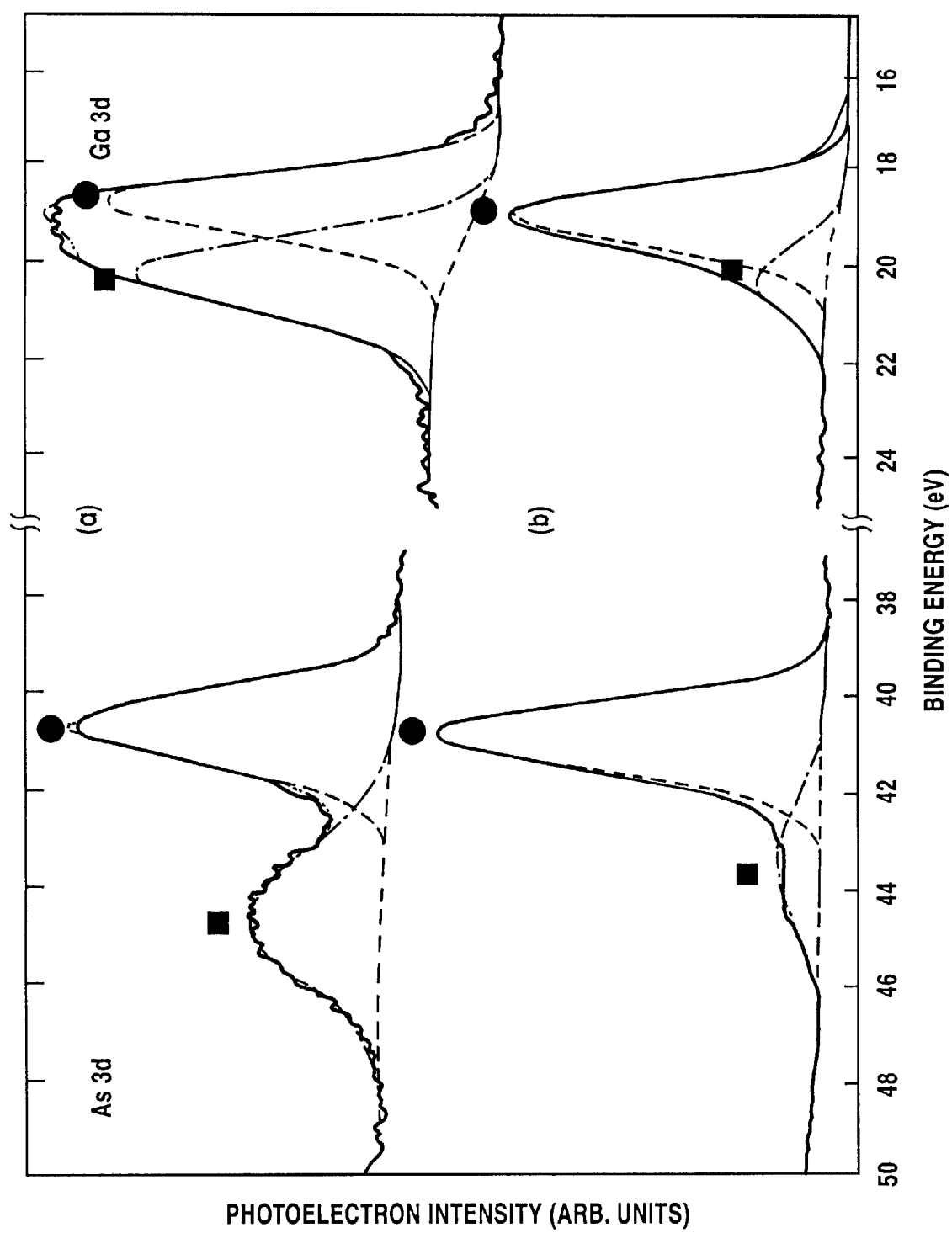
FIG. 4 shows a result of an experiment confirming the effect of the pre-treatment.

FIG. 4 shows a result of an experiment confirming the effect of the pre-treatment. The treatment confirmed in this experiment is the surface cleaning that a native oxide layer on a gallium arsenide semiconductor surface is removed by the hydrogen radicals as described. In FIG. 4, (a) is a result of observation of the gallium arsenide semiconductor surface before the treatment by the X-ray photoelectron spectroscopy (XPS) method. (a) demonstrates the existence of Ga—O bond and As—O bond (designated by ■ plotting) in gallium arsenide. On the other hand, (b) in FIG. 4 is a result of observation of the gallium arsenide semiconductor surface after the treatment by the XPS method. (b) demonstrates that the peaks designating the existence of Ga—O bond and As—O bond at (a) are significantly decreased or almost disappears, that is, as little as those are scarcely detected. This result demonstrates the native oxide layer is almost removed by this surface cleaning treatment. And, the high effect of this treatment is also confirmed by this result.

Operation of the apparatus of the mode is described as follows. This is also a description of a thin film deposition method of a mode of the invention.

First of all, substrate 20 is transferred into process chamber 1 through a gate-valve (not shown) and is held by substrate holder 2. Process chamber 1 is pumped by pumping system 11 to a certain pressure. Heater 21 heats is substrate 20 up to a certain temperature. And, treatment gas introduction system 6 is operated so as to introduce a treatment gas into process chamber 1. The introduced treatment gas arrives at substrate 20 via thermal catalysis body. This results in that a contact decomposition reaction takes place and a treatment is carried out on the surface of substrate 20 utilizing this reaction. Next, after the operation of treatment gas introduction system 6 is stopped and process chamber 1 is pumped again, deposition gas introduction system 3 is operated so as to introduce a deposition gas into process chamber 1. The introduced deposition gas is supplied with substrate 20 via thermal catalyst body 5. This results in that another contact decomposition reaction takes place and a thin film deposition is carried out on the surface of substrate 20 utilizing this reaction.

In the process described above, the CAT-CVD film grows on the pre-treated clean surface which is not contaminated, because the pre-treatment and the deposition are carried out continuously in the same process chamber 1. Therefore, this process is very effective for reduction of interfacial defects. If another process is interposed or substrate 20 is exposed to atmosphere between the pre-treatment and the deposition, the surface of substrate 20 may suffer contamination such as native re-oxidation, which diminishes the technically advantageous effect of the pre-treatment.

Deposition temperature is a significant parameter in the process described above. For example, if deposition temperature exceeds 400° C. in film depositions on a semiconductor of gallium arsenide series, the semiconductor surface becomes rough because arsenic atoms thermally dissociate from gallium arsenide. Many kinds of interfacial defects are produced when an insulator film is deposited on such a rough surface as this. Therefore, the deposition temperature in this case is significantly kept below 400° C.

And, temperature of substrate 20 is preferably kept lower than a critical value where substrate 20 suffers thermal degradation in general. For example, if a metal wiring is formed with substrate 20, when substrate 20 is heated over the melting point of the wiring material, melting of the metal wiring may occur causing wiring defects. Therefore, temperature of substrate 20 during deposition is preferably kept below the melting point of the wiring material. Such a deposition temperature control as this can be easily established by providing an adequate control system with heater 51 of thermal catalysis body 5.

Figure 5:
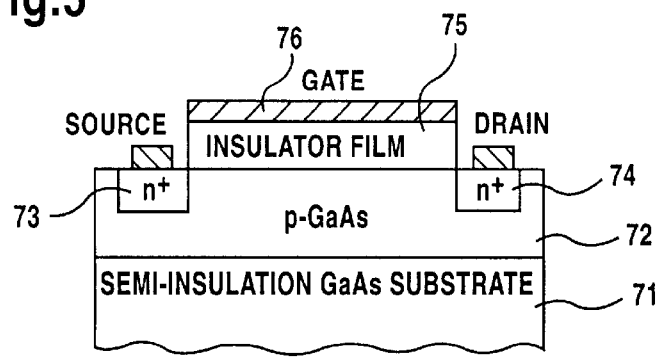
FIG. 5 schematically shows a structure of a semiconductor device of a mode of the invention.
Figure 6:
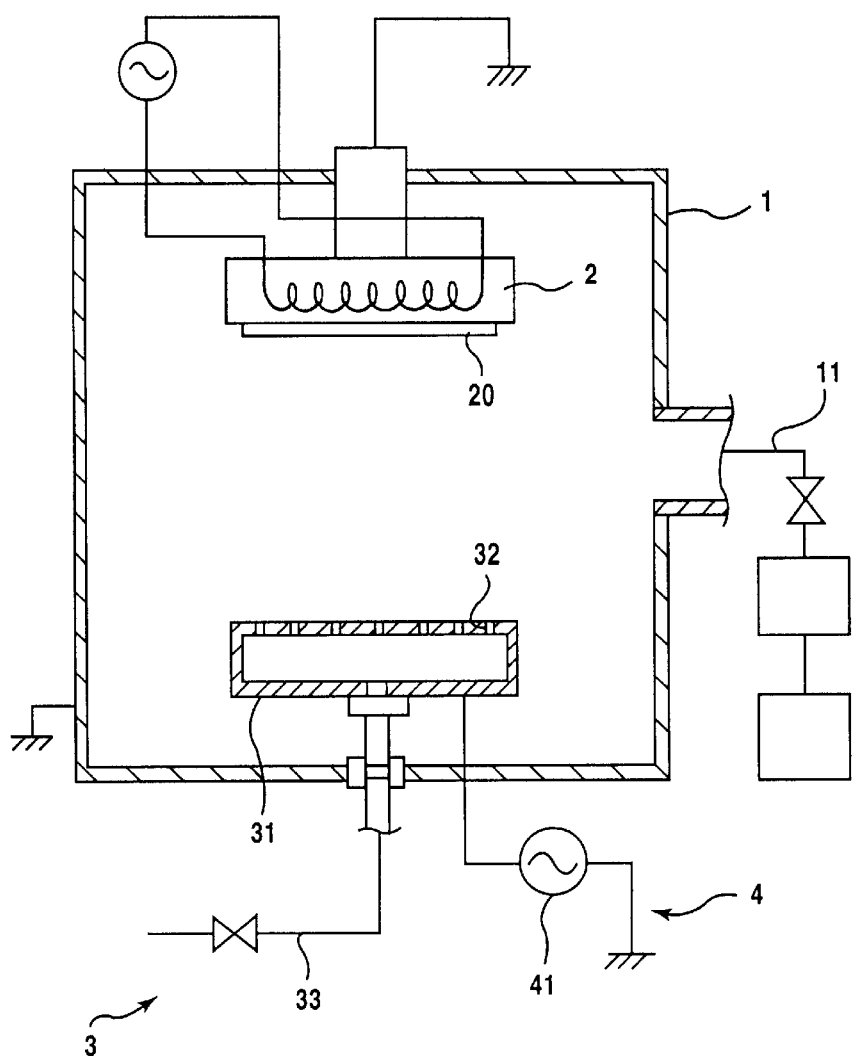
FIG. 6 shows a schematic view of a PECVD apparatus as an example of prior thin film deposition apparatuses.

Next is a description of a semiconductor device of a mode of the invention. FIG. 5 schematically shows a structure of a semiconductor device of a mode of the invention. The semiconductor device of the invention is one having a semiconductor-insulator junction where a insulator film is deposited on an underlying semiconductor. There are many kinds of semiconductors having such a structure as this. FIG. 5 shows a structure of a IGFET as an example.

The semiconductor device shown in FIG. 5 have a structure where $n^+$source-drain 73,74 are formed with $p^-$-GaAs region 72 on semi-insulating Gas substrate 71, and gate 76 is formed between source 73 and drain 74 interposing insulation film 75. This semiconductor device is operated on the inversion-accumulation mode as well as normal MOS-FETs. When bias voltage is applied from gate 76 through insulation film 75, an inversion region is formed on the $p^-$-GaAs region 72 to become a n-channel which makes operation of the FET possible.

It has been widely said that operation of IGFET is very difficult because high-density interfacial energy levels on the semiconductor-insulator interface makes it difficult to form the inversion region. With the semiconductor device of this mode, however, the interfacial energy levels is reduced down to or less than $10^{12}eV^{-1}cm^{-2}$ because the insulator film is deposited by the process where the pre-treatment and the CAT-CVD are continuously carried out. With prior semiconductor devices of gallium arsenide series interfacial energy level densities are $10^{13}eV^{-1}cm^{-2}$ or more. So, the semiconductor device of this mode has achieved the interfacial level density reduction more than one order. This means that the operation of IGFET, which has been thought impossible, becomes possible. IGFET of gallium arsenide series has the advantage that circuit design can have large variety because there is no leak current from the gate, compared to metal-semiconductor FET (MESFET) which is widely used in ICs.

With the semiconductor device shown in FIG. 5, for example, insulator film 75 is silicon nitride film and gate 76 is made of aluminum. Generally, the interfacial level density can be measured from capacitance-voltage characteristic of such a metal-insulator-semiconductor multilayer structure (MIS structure) as this.

As modes of the invention, any semiconductor devices having a semiconductor-insulator junction other than the described IGFET can be adopted. Passivation by depositing a insulator film on a semiconductor surface is widely carried out. Depositing this passivation film by the method and apparatus of the invention, low-density interfacial level junction is obtained, which contributes to diminishing problems caused by interfacial traps such as generation of noise.

In described each mode of the invention, Si, Ge, SiGe, SiC, GaAlAs, GaP, InP, ZnSe or CdS also can be used as material of the underlying semiconductor other than gallium arsenide (GaAs). Silicon oxide film, silicon oxygen nitride film, aluminum nitride film or aluminum oxide film also can be used as the insulator film other than silicon nitride film.

The idea of the invention is in depositing a thin film on a substrate surface of material dissimilar to the thin film, namely heterojunction. So, the invention can be modified into a composition where a metal film is deposited on a semiconductor surface or an insulator film is deposited on a metal surface. There is another modification where a semiconductor film is deposited on an underlying semiconductor of dissimilar material. Anyway, reduction of interfacial defects or the interfacial level density is the general demand. Therefore, the invention satisfying this demand has great significance.

In the composition of the invention, the thin film deposition after the pre-treatment may be carried out by a method other than CAT-CVD. PECVD or other thermal CVD may be employed in case that damage by plasma makes no problem or higher deposition temperature is allowed.

The thermal catalysis body in the invention may be made of molybdenum, tantalum, titanium or vanadium other than tungsten. In studies by the inventors, the thermally catalytic effects with these materials were confirmed. Any shapes of the thermal catalysis body such as a spiral, swirl or mesh may be employed other than the saw-tooth-wave. A blade-or rod-shaped thermal catalysis body also may be used other than using a wire. A treatment such as electrolytic polishing is given on the surface of the thermal catalysis body if necessary. When the thermal catalysis body is used at temperatures over 1500° C. introducing a silicon compound gas such as silane, silicide is occasionally formed on the surface of the thermal catalysis body. In this case, the thermal catalysis body is preferably replaced with a new one or one having a clean surface.

Describing the terminology of "via thermal catalysis body", that does not always mean a gas molecular contacts physically on the surface of the thermal catalysis body. This is because the inventors would not deny the possibility that the catalytic reaction can occur without any physical contact on the thermal catalysis body. In other word, the catalytic reaction may occur even if a gas molecular gets close to the surface of the thermal catalysis body.

What is claimed is:

1. Apparatus for depositing a thin film on a substrate surface, comprising:

a process chamber;

a substrate holder provided in said process chamber;

a thermal catalysis body provided near said substrate holder;

a heater for heating said thermal catalysis body as far as said substrate does not suffer thermal degradation;

deposition gas introduction system for introducing a deposition gas into said process chamber; and treatment gas introduction system introducing a treatment gas, which is provided other than said deposition gas introduction system, wherein said thermal catalysis body is provided at a location between said substrate and both of said deposition gas introduction system and said treatment gas introduction system such that said thin film is deposited on said substrate surface utilizing reaction of said deposition gas supplied with said substrate surface via said thermal catalysis body and a treatment for reducing interfacial defects between said substrate surface and said thin film is carried out by supplying said treatment gas with said substrate via said thermal catalysis body in said chamber before said thin film deposition.

2. Apparatus for depositing a thin film on a substrate surface as claimed in claim 1, wherein material of said substrate surface is semiconductor and said thin film is insulator.

3. Apparatus for depositing a thin film on a substrate surface as claimed in claim 2, wherein material of said substrate surface is Si, Ge, SiGe, SiC, GaAs, GaAlAs, GaP, InP, ZnSe or CdS.

4. Apparatus for depositing a thin film on a substrate surface as claimed in claim 1, wherein said thin film is silicon oxide film, silicon nitride film, silicon oxygen nitride film, aluminum nitride film or aluminum oxide film.

5. Apparatus for depositing a thin film on a substrate surface as claimed in claim 1, wherein said material of said substrate surface is semiconductor of GaAs series, said treatment gas is a nitrogen bearing gas or hydrogen gas, and said treatment is surface cleaning or surface denaturalizing utilizing radicals decomposed from said treatment gas by said thermal catalysis body.

6. Apparatus for depositing a thin film on a substrate surface as claimed in claim 5, wherein said heater heats said thermal catalysis body as far as that temperature of said substrate is kept below 400° C.

7. Apparatus for depositing a thin film on a substrate surface as claimed in claim 1, wherein said substrate has a wiring for an integrated circuit and said heater heats said thermal catalysis body as far as said temperature of said substrate does not exceed the melting point of said wiring.

8. Apparatus for depositing a thin film on a substrate surface as claimed in claim 1, wherein said thermal catalysis body is made of tungsten, molybdenum, tantalum, titanium or vanadium.

9. Apparatus for depositing a thin film on a substrate surface as claimed in claim 1, wherein said treatment is to clean said surface by radicals produced on said catalysis body.

10. Apparatus for depositing a thin film on a substrate surface as claimed in claim 9, wherein said treatment gas is hydrogen and said treatment is to make hydrogen radicals react with oxygen in a natural oxide layer on said surface, thereby removing said natural oxide layer.

11. Apparatus for depositing a thin film on a substrate surface as claimed in claim 1, wherein said treatment gas is to make stable bonds on said surface.

12. Apparatus for depositing a thin film on a substrate surface as claimed in claim 11, wherein said treatment gas is nitrogen bearing gas and said treatment is to make nitrogen radicals react with said surface, thereby forming bonds of nitride on said surface.

13. Apparatus for depositing a thin film on a substrate surface as claimed in claim 1, wherein both said deposition gas introduction system and said treatment gas introduction system commonly use a gas introduction head provided in said process chamber so as to effuse said deposition gas or said treatment gas.

* * * * *